United States Patent [19]

Strickland et al.

[11] Patent Number: 4,647,849
[45] Date of Patent: Mar. 3, 1987

[54] TWO DIMENSIONAL NON-FIELD PERTURBING, DIODE DETECTED, DOUBLE GAPPED, HIGH SENSITIVITY, B-DOT ELECTROMAGNETIC FIELD PROBES

[75] Inventors: Brian R. Strickland, Laceys Spring; George R. Edlin, Huntsville, both of Ala.

[73] Assignee: The United States of America as represented by the Secretary of the Army, Washington, D.C.

[21] Appl. No.: 732,538

[22] Filed: May 10, 1985

[51] Int. Cl.[4] .................................................. G01R 23/04
[52] U.S. Cl. ........................................ 324/95; 324/72.5
[58] Field of Search .................. 324/95, 72.5; 340/600; 363/59–61; 455/67; 343/703, 741, 850

[56] References Cited

U.S. PATENT DOCUMENTS

| 4,207,518 | 6/1980 | Hopfer | 324/95 |
| 4,392,108 | 7/1983 | Hopfer | 324/95 |
| 4,588,993 | 5/1986 | Babij et al. | 343/703 X |

Primary Examiner—Reinhard J. Eisenzopf
Assistant Examiner—Jack B. Harvey
Attorney, Agent, or Firm—Freddie M. Bush; Robert C. Sims

[57] ABSTRACT

A two dimensional portable double gap detected probe for measuring B fields in large test volumes which are remote from electrical power. The probe is small, portable, and constructed for minimum field perturbation. The output of the probe is read by an ordinary high impedance volt meter, which is easily portable, and does not require external power.

5 Claims, 3 Drawing Figures

TWO DIMENSIONAL NON-FIELD PERTURBING, DIODE DETECTED, DOUBLE GAPPED, HIGH SENSITIVITY, B-DOT ELECTROMAGNETIC FIELD PROBES

DEDICATORY CLAUSE

The invention described herein may be manufactured, used, and licensed by or for the Government for governmental purposes without the payment to us of any royalties thereon.

BACKGROUND OF THE INVENTION

Present methods of measuring electromagnetic fields utilize either coaxial cables to conduct the electromagnetic energy to complex measuring instruments or twisted pairs to conduct detected electromagnetic energy to the measuring device. This invention eliminates the many problems that exist with present field measuring techniques by providing for the following: (1) The use of non-interfering semiconductor line, which greatly reduces field perturbations and increases accuracy because of reduced field pick-up in the transmission lines. (2) Detection of the field which eliminates the need for expensive complex monitoring equipment. (3) The use of Teflon, reduces the apparent electrical size of the measuring proble, therefore reducing field perturbations. (4) Cancellation of E-field pick-up by the use of a double detected gap configuration. (5) A wide bandwidth operation, which makes it suitable for automated field measuring systems. (6) An easy method for changing probe orientation by means of a swivel mount. (7) Allows the measurement of extremely small field strengths because of the circuit configuration.

The double gapped B-dot probes currently used to measure B field and exclude the E field are three dimensional undetected loops. This probe is a matched series parallel combination of loops which match a 50 ohm input of a tuned receiver or a power meter. This type probe must be constructed utilizing double sided flexible printed circuit board with low loss dielectric. This material is necessary to implement the complex stripline matching networks. In addition, the assembly of these loops are extremely difficult, time consuming, and the probes are difficult to maintain. The required power meters and receivers utilized to measure the output of these type loop probes are very expensive and hard to use for remote field measurements.

The two dimensional double gap detected probe described in this disclosure is used to measure B fields in large test volumes which are remote from electrical power. Due to the large number of measurement points required to map test volumes and remoteness of some areas of interest, the probes need to be portable. In addition, the probe must be small and non-perturbing to the field being measured. The probe described in this disclosure is small, portable, and designed for minimum field perturbation. The output of the probe is read by an ordinary high impedance volt meter, which is inexpensive, small, easily portable, and does not require external power.

SUMMARY OF THE INVENTION

This invention uses non-interfering semi-conductor lines so as to greatly reduce field perturbations and increase accuracy because of reduced field pick-up in the transmission lines. Teflon is used so as to reduce the apparent electrical size of the measuring probe, therefore reducing field perturbations. A double detected gap configuration, which gives cancellation of E-field pick-up eliminates expensive complex monitoring equipment, is provided along with a swivel mount.

It is an object of this invention to provide a wide bandwidth operation, which makes it suitable for automated field measuring systems. Another object of this invention is to provide an easy method for changing probe orientation by means of a swivel mount and to allow the measurement of extremely small field strengths because of the circuit configuration.

DESCRIPTION OF THE BEST MODE AND THE PREFERRED EMBODIMENT

Figure 1:
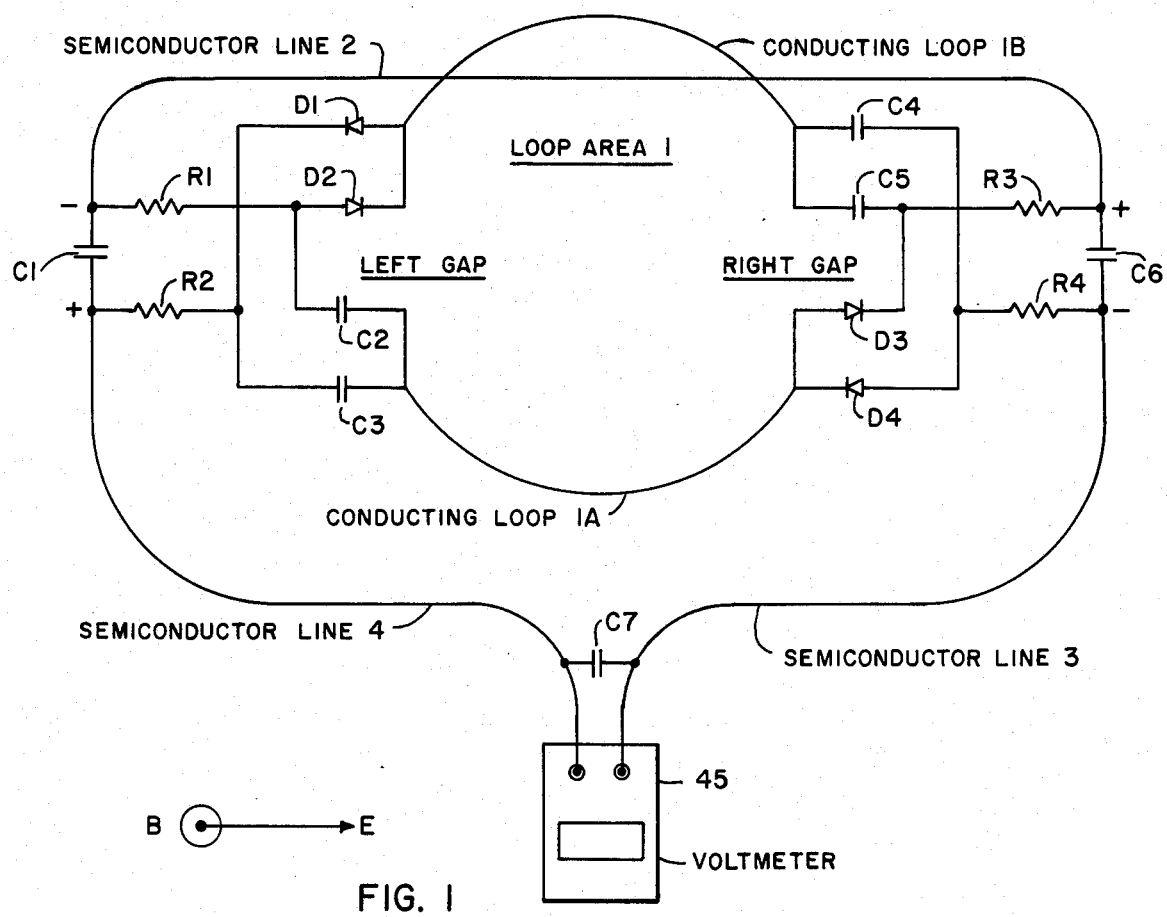
FIG. 1 is a schematic illustration of the present invention.
Figure 3:
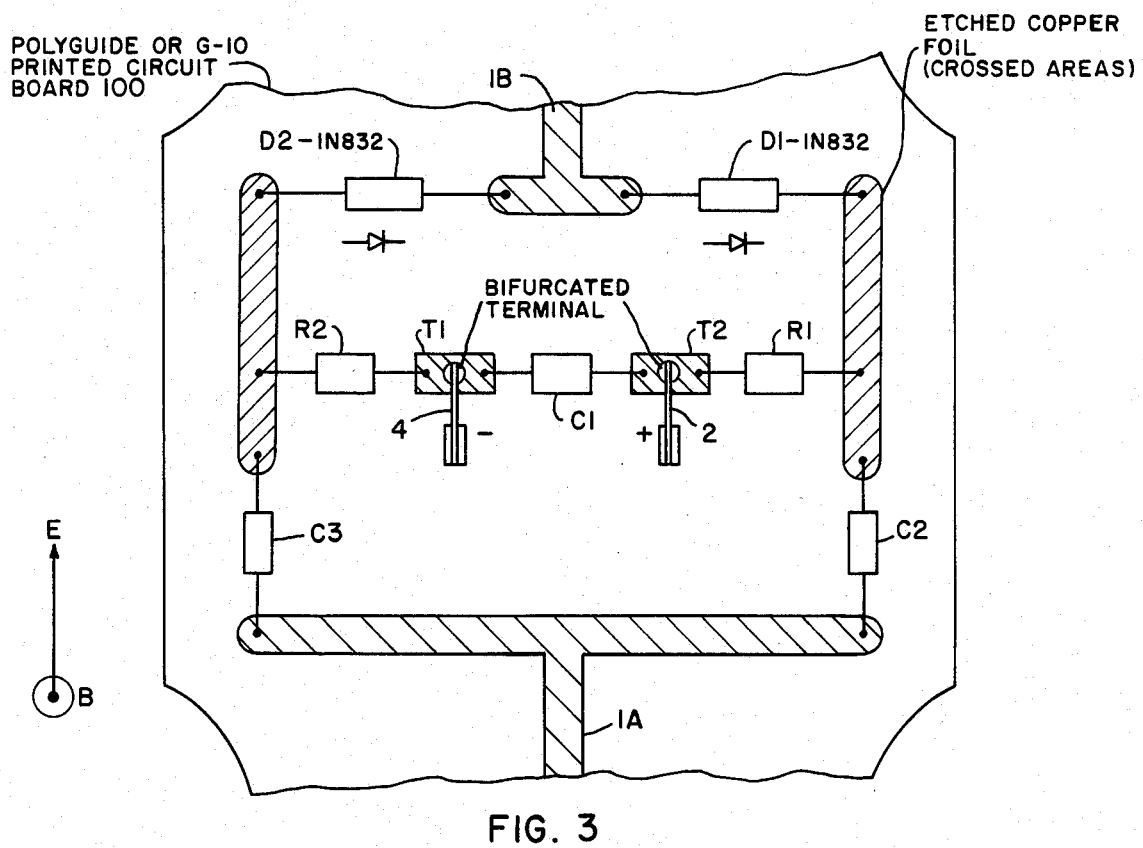
FIG. 3 is a pictorial showing of the left gap of the present invention.
Figure 2:
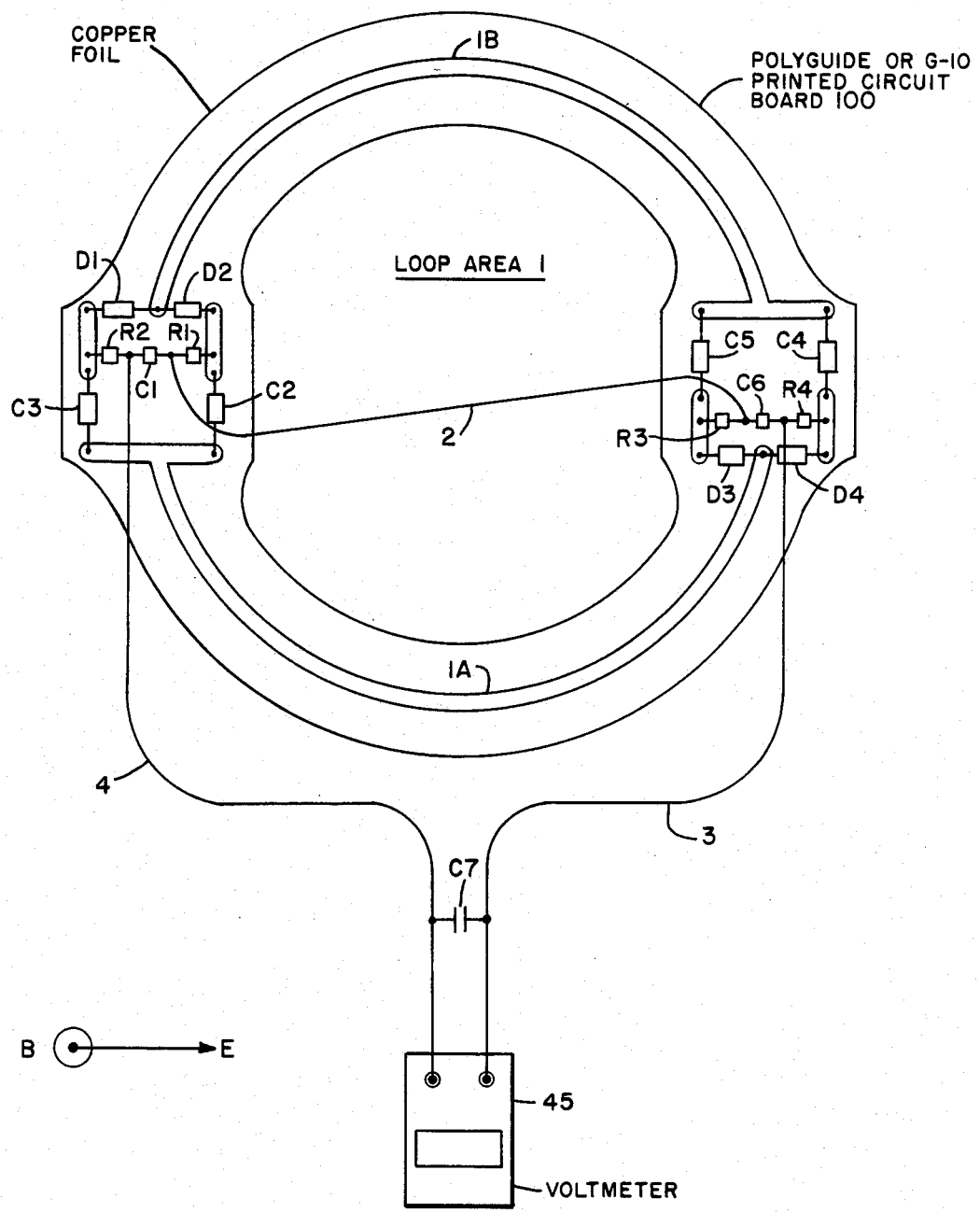
FIG. 2 is a pictorial showing of the overall invention.

The electrical schematic of the detected B-dot probe is shown in FIG. 1. The overall pictorial of the probe is shown in FIG. 2. The details of the left gap is shown in FIG. 3. The right gap is constructed in the same manner as the left gap. If chip components are used instead of discrete, the gap size can be reduced to very small dimensions allowing the probe to be used at extremely high frequencies. The probe is designed to be used with the E-field horizontal (perpendicular to the gap) and the B-field perpendicular to the plane of the loop as shown in FIGS. 1 and 2, but even if the E-field is vertical (parallel to the gap) as shown in FIG. 3, the double gap design gives cancellation of the E-field pick-up in the loop system. This leaves only the B-field magnitude information present in the probe output voltage. This is accomplished due to the pick-up in the left gap being 180° out of phase with the pick-up in the right gap. They will cancel each other out when combined.

The make-up and operation of the probe referring to FIG. 1 is as follows: The oscillating B-field in the loop area induces a voltage in the conducting loop (see FIG. 1) given by the relationship V=A dB/dt, where V is the voltage output of the loop, A is the area of the loop and dB/dt is the derivative of the time varying B-field. This voltage is DC shifted by the high frequency voltage doublers (C2, C3, D1, D2) or (C4, C5, D3, D4) and filtered by the low pass filters (R1, R2, C1, or R3, R4, C6). The DC outputs of the low pass filters are summed together by semiconductor line 2 and brought out of the field by semiconductor lines 3 and 45 to a voltmeter 4 having capacitor C7 across it. The semiconductor lines are used to minimize the field pick-up in the transmission lines as well as minimize field perturbations. Voltmeter 4 can be an ordinary inexpensive high impedance voltmeter which does not require external power. Typical dimensions of the probe are 2" by 2".

The calibration of the system is accomplished in a known field. This relates the reading on the voltmeter to the $\beta$-field (magnetic flux density). Additionally, the $\beta$-field measurements made in the far field can be converted to E-field using the simple relationship E=377H, where E is the electric field, 377 is the free space wave impedance, and H=B/$\mu_o$=magnetic field intensity with $\mu_o = 4\pi 10^{-7}$ free space permeability.

FIG. 3 shows details of the left gap. The right gap is identical if rotated 180° (see FIG. 2). Diodes are IN832's. Bifurcated terminals T1 and T2 are provided for connections to lines 2 and 4. The entire circuit (see also FIG. 2) is on a polyguide or 6-10 printed circuit board 100 which is double sided and flexible and has a low loss dielectric. The gap is reduced in size and microminiature chip capacitors and resistors are used in the high frequency loop. Polyguide or Teflon may be preferable for the high frequency sensor, as it is more transparent to RF and reduces the apparent electrical size.

Typical component design calculations

The following discussion refers to FIGS. 1, 2, and 3 and outlines the contraints used to pick component valves for a probe designed to operate between 1 and 500 MHZ.

The radiation resistance $R_r$ of a small (below resonance) one turn circular loop is given by $$R_r = 20\pi^2 \frac{2\pi a}{\lambda} 4 \qquad (1)$$

where
  $\lambda$ = wave length
  $a$ = loop radius

The total ohmic losses or resistance for an one-turn circular loop given by $$R_{ohic} = \frac{a}{b} R_s \left( \frac{R_p}{R_o} + 1 \right) = \frac{\phi}{b} R_s$$

where
  $a$ = loop radius
  $b$ = wire radius $$R_s = \sqrt{\frac{\omega \mu_o}{2\alpha}} = \text{surface impedance of conductor}$$

surface impedance of conductor
  $w = 2\pi f$ = angular frequency in rad/sec
  $f$ = frequency in hertz
  $\alpha$ = wire conductivity in mhos/m
  $\mu_o$ = permittivity of vacuum
  $R_p$ = ohmic resistance due to proximity effects
  $R_o = (R_s/2\pi b)$ = ohmic skin effect resistance per unit length (ohms/m)
with $(R_p/R_o) = 0$ since wr only have 2 isolated loops To be non-perturbing non-resonant probe the loop radius a should be approximately no greater than $a = \lambda/10$. For a single turn circular loop this gives the radiation resistance from equation 1 to be $0 < Rr < 30.8$ For a probe that is designed to have a maximum operating frequency of 500 MHZ this gives a maximum probe radius of 2.4 inches. Assuming copper as the conductor ($\alpha = 5.8(10^7)$ mhos/m) and a wire radius of 0.05 inches equation 2 yields, $0 < R_{ohmic} < 0.28$ This makes the worse case effiency to be $$\text{eff} = 100 \left( \frac{30.8}{30.8 + .28} \right) = 99.1\%$$

The design guide for the capacitors is that the reactance of the capacitors of the highest frequency of interest be at least 10 times the total resistance of the loop. This is to prevent loop loading. For the case mentioned above this gives as a minimum capacitance reactance of approximately 300 ohms which gives a maximum capacitance of $$C_2 \leq \frac{1}{308\omega} \leq 10.3 \, pf \text{ at } f \leq 500 \text{ MHz}$$

The lowest frequency of interest and the minimum load resistance determines the minimum capacitance that can be used. This is because of the RC time constant of the system. Assuming a typical minimum load resistance of 1M $\Omega$ and a lowest frequency of 1 MHz yields a minimum capacitance of $$C_2 \geq \frac{1}{RF} = 1 \, pf$$

The above gives limits on the capacitors shown in FIG. 1 an labeled as C2, C3, C4, and C5. The load resistances mentioned above are the resistors labeled R1, R2, R3, and R4. D1, D2, D3, and D4 are operated in the forward biased mode and need to be RF diodes with good operating characteristics and low shunt capacitance at the highest frequency of interest. Because of the turn-on characteristics of most silicon RF diodes, RF Schottky barrier diodes might be considered for probe operation especially in very low electromagnetic fields. This is not to say that a standard RF silicon diodes will not work but is merely saying that the output voltage may be less than that obtained by using a Schottky diode. The combination of C2, C3, D1, D2, and C4, C5, D3, D4 are two different voltage doubling circuits made for operation at high frequency. The combination of R1, R2, C1 and R3, R4, C6 are two different low pass filters. C1 (C6) is chosen dependent on the lowest frequency of interest to give at least 20 dB attenuation of the high frequency ripple. With this as the criteria
  $R_1 = R_2 = 500$ K$\Omega$ and f low = 1 MHz C1 (C6) is calculated as $$C1 \, (C6) = \frac{10}{2\pi} \, (R1 + R2) = 1.6 \, p^f \text{ MIN}$$

$C_7$ and the resistance of the carbon line act as a low pass filter with Rline = (length of line) Rohms/length = (10 meters)

$$\left( \frac{25K\Omega}{\text{meter}} \right) = 250K\Omega.$$

Therefore, $$C_7 \geq \frac{1}{2\pi f \min(2 \, R\text{line})} = .32 \, p^F$$

$C_7$ also determines the speed of response of the system.

For tr=response time≤1 sec $$C_7 \leq \frac{tr}{2\, R\text{line}} = 2\, \mu F$$

The probe measurements system presented measures B fields more accurately than existing systems, since it is smaller and therefore perturbs the field less. Semiconductor lines are utilized instead of coaxial cable to remove the information from the field thereby further reducing field perturbations and minimizing field pickup. It is also very portable which makes it easy to make a large number of measurements quickly. It is simple and inexpensive to build. Also, the DC output voltage and wide bandwidth makes the probe easy to interface to a computerized system for both field control and automated field measurements without use of expensive power meters and measurement equipment. A typical useable bandwidth is approximately 1000 to 1 (example: 1 MHz to 10000 MHz).

The use of the voltage doublers plus summing together the outputs from both gaps give a probe that is very sensitive. If Schottky diodes are used as the detecting elements then it is expected to be able to measure field strengths down to extremely low levels (1 mv/meter).

We claim:

1. A high frequency (exceeding 1 MHz) electromagnetic detector comprising a detecting loop; first and second gaps arranged symmetrically in said loop; first and second voltage doublers located respectively in said first and second gaps for completing a circuit and providing a rectified output; and connection means connected across said first and second voltage doublers for causing cancellation of any E-field pick-up in the loop.

2. A detector as set forth in claim 1 further comprising a measuring means connected to said first and second voltage doublers.

3. A detector as set forth in claim 1 wherein said loop is mounted on a polyguide so as to be two dimensional and said detector being constructed so as to be used with the E-field horizontal (perpendicular to the gaps) and the B-field perpendicular to the polyguide.

4. A detector as set forth in claim 3 further comprising a measuring means having first and second terminals; said first terminal being connected to said first voltage doubler; and said second terminal being connected to said second voltage doubler.

5. A detector as set forth in claim 4 wherein the connections to said measuring means are each semiconducting lines.

* * * * *